(12) United States Patent  
Calin et al.

(10) Patent No.: US 6,195,278 B1
(45) Date of Patent: Feb. 27, 2001

(54) CONTENT ADDRESSABLE MEMORY CELLS AND WORDS

(75) Inventors: Liviu Calin, Kanata; Radu Avramescu, Nepean, both of (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/475,046

(22) Filed: Dec. 30, 1999

(51) Int. Cl.[7] .................................................. G11C 15/00
(52) U.S. Cl. .......................... 365/49; 365/189.07; 365/203
(58) Field of Search .............................. 365/49, 189.05, 365/189.07, 203, 154, 156

(56) References Cited

U.S. PATENT DOCUMENTS

| 5,034,919 | | 7/1991 | Sasai et al. | 365/49 |
|---|---|---|---|---|
| 5,351,208 | | 9/1994 | Jiang | 365/49 |
| 5,422,838 | | 6/1995 | Lin | 365/49 |
| 5,446,685 | * | 8/1995 | Holst | 365/49 |
| 5,453,948 | * | 9/1995 | Yoneda | 365/49 |
| 5,490,102 | * | 2/1996 | Jubran | 365/49 |
| 5,495,382 | | 2/1996 | Albon | 365/49 |
| 5,828,593 | | 10/1998 | Schultz et al. | 365/49 |
| 5,859,791 | | 1/1999 | Schultz et al. | 365/49 |

* cited by examiner

*Primary Examiner*—Son Mai

(57) ABSTRACT

Modifications to CAM cell designs are required as supply voltages utilized decrease. In one possible modified design, when a reference bit applied to the CAM cell matches a stored bit, p-channel pass transistors within the CAM cell can pass a full logical high to an n-channel chain transistor coupled within a NAND configuration with other CAM cells. This full logical high can result in increased transition speed, a decrease in degradation, and/or a decrease in power dissipation for the n-channel chain transistor. Further, compared to using n-channel pass transistors, the use of p-channel pass transistors to transfer the logical high voltage can increase the transition speed, decrease the degradation, and/or decrease the power dissipation for the pass transistors. Alternatively, the use of n-channel pass transistors and a p-channel chain transistor can gain similar advantages if the logic was opposite.

17 Claims, 10 Drawing Sheets

CONTENT ADDRESSABLE MEMORY CELLS AND WORDS

FIELD OF THE INVENTION

This invention relates generally to Content Addressable Memory (CAM) and, in particular, to cells and words within CAM arrays.

BACKGROUND OF THE INVENTION

CAMs are memories in which data is elected based on its contents, rather than its physical location. This function is useful for many applications, especially when performing a look-up for the purposes of mapping from a long identification word to a shorter word. This operation is required in many telecom functions, including Asynchronous Transfer Mode (ATM) address translation.

The design of a standard CAM comprises an array of individual CAM cells configured into rows and columns. Typically, each individual CAM cell can store a single bit of data during a write operation and compare that stored bit with a reference bit during a comparison operation, this comparison operation determining if the stored bit and the reference bit match. In one common implementation, each row represents a different one of w words of b bits, the number of rows and columns equalling w and b respectively. Within a comparison operation, the bits of data stored within the CAM cells of a single word are each compared to a different reference bit, the reference bits together combining to generate a reference data word. If each and every one of the reference bits within the reference data word matches its corresponding stored bit within the stored word, a match is deemed to be achieved. Otherwise, the match has failed.

For the common implementation described above, the total number of CAM cells within an array equals the number of words multiplied by the number of bits per word (wxb). Hence, despite the power and speed of each individual CAM cell not significantly effecting the overall operation of the CAM, the large number of CAM cells required in a standard CAM makes the design of the CAM cell particularly critical to the performance parameters of a standard CAM. These performance parameters include the power consumption, reliability and overall speed of the CAM.

There are numerous well-known embodiments for CAM cells, each of these embodiments having different advantages and disadvantages. Some common CAM cell designs, as depicted in FIG. 1A for instance, are implemented within a NOR configuration such that the CAM cells are coupled together by a match line 20 which is precharged to a logical high. In these designs, a mismatch between the stored bit and the reference bit causes one of two n-channel pass transistors 22 to forward a logical high to the gate of an n-channel pull-down transistor 24 coupled to the match line 20. This logical high turns on the n-channel pull-down transistor 24 which results in a logical low being applied to the match line 20. In this case, if any one of the CAM cells within a word pull the match line 20 to a logical low, the reference data word is deemed to have a mismatch with the stored word.

Since the number of mismatches are typically much larger than the number of matches, the power consumption resulting from this CAM cell design being implemented within a CAM array is significant due to the logic transitions caused by each mismatch. Further, the transferring of logical highs via the n-channel pass transistors 42 in cases of mismatches can result in less than a full logical high being applied to the gates of the n-channel pull-down transistors 44, an increased speed of degradation for the n-channel pass transistors 42 due to the hot electron effect, and a decreased transition speed. These problems become more significant as the supply voltages utilized decrease and the size of the fabrication processes used to generate the microelectronic components containing CAMs decrease.

In other common CAM designs, the CAM cells are implemented within a NAND configuration as depicted in FIG. 1B, such that the CAM cells are coupled together by a match line 30. In this case, each CAM cell includes an n-channel chain transistor 34 that is coupled in series with other similar n-channel chain transistors that correspond to other CAM cells within a stored word. Prior to a comparison operation, a first end of the match line is precharged to a logical low with a precharge circuit (not shown). When a comparison operation is initiated, the precharge circuit causes a transition at the first end of the match line from a logical low to a logical high. For each of the CAM cells, if a match occurs between the stored bit within the particular CAM cell and the applied reference bit, one of two n-channel pass transistors 32 pass a logical high to the gate of the n-channel chain transistor 34 within the particular CAM cell. This passed logical high is not a full logical high but initially is approximately a threshold voltage below a full logical high.

If the reference bit applied to the CAM cell adjacent to the precharge circuit corresponds to the stored bit within the particular CAM cell, a boot strapping operation occurs between the gate and drain of the n-channel chain transistor of this CAM cell such that the voltage on the gate of the n-channel chain transistor is increased to a logical high voltage which is greater than a normal full logical high. This in turn results in the transistor passing essentially a full logical high to the drain of the n-channel chain transistor of the adjacent CAM cell. If the remainder of the CAM cells within the word each have their applied reference bit match their stored bit, subsequent boot strapping operations occur along the match line such that eventually a logical high voltage is propagated to a second end of the match line where it can be sensed by a sense circuit (not shown).

This NAND configuration for the CAM cells reduces the power consumption for the CAM compared to the NOR configuration since significant logic transitions only occur during a match, which as stated above is normally less common than a mismatch. One key problem with the well-known NAND configuration as described above with reference to FIG. 1B is the need to have a boot strapping operation occur within each of the n-channel chain transistors in order to effectively propagate the logical high to the second end of the match line. The use of boot strapping operations result in a number of disadvantages. For one, the high voltage, which is greater than a normal logical high voltage, generated on the gate of the n-channel chain transistors during a match condition due to the boot strapping operation results in higher than normal degradation rates of the n-channel chain transistors and n-channel pass transistors due to hot electron effects. Further, these high voltages on the gates of the n-channel chain transistors are indefinite and not fully reliable since they are generated through a dynamic condition. This unreliability of the gate voltages decreases the reliability of the high voltages that are passed by the n-channel chain transistors, especially as the supply voltages utilized are being decreased in recent designs. Yet further, the boot strapping operation that occurs within each of the n-channel chain transistors slows the propagation of the logical high significantly and hence reduces the speed of the comparison operation altogether. Even further, in the dynamic situation, there is a drain to source voltage drop through each of the n-channel chain transistors which limits the number of n-channel chain transistors that can be coupled in series and still allow for sensing of the match condition.

The above described problems with the boot strapping operations become increasingly significant in more recent designs in which the supply voltages utilized decrease in voltage levels and the fabrication processes used to generate the microelectronic components containing CAMs decrease in size.

SUMMARY OF THE INVENTION

The present invention is directed to a modified CAM cell design which can be used as supply voltage levels and fabrication process sizes decrease. In preferred embodiments, when a reference bit applied to the CAM cell matches a stored bit, p-channel pass transistors within a CAM cell pass a full logical high to an n-channel chain transistor coupled within a NAND configuration with other CAM cells. This full logical high can result in an increased reliability in the n-channel chain transistors' gate voltages, increased transition speeds, a decrease in degradation of the transistors involved, and/or a decrease in power dissipation for the n-channel chain transistor. Further, compared to using n-channel pass transistors, the use of p-channel pass transistors to transfer the logical high voltage can increase the transition speed, decrease the degradation, and/or decrease the power dissipation for the pass transistors.

The present invention, according to a first broad aspect, is a content addressable memory comprising a memory cell, a plurality of pass transistors of a first channel type and a match transistor of a second different channel type. The plurality of pass transistors are connected to the memory cell such that a logic state of the memory cell controls the conductivity of respective data paths through the pass transistors. The match transistor is connected to the data paths of the pass transistors for determining a match condition. Preferably, in this aspect, the match condition comprises enabling conductivity through a data path of the match transistor. Further, the memory cell preferably comprises an SRAM cell.

The present invention, according to a second broad aspect, is a content addressable memory comprising a memory cell having a true output and a complement output, a first field effect transistor of a first channel type, true and complement bit lines, and second and third field effect transistors of a second different channel type. In this aspect, the first transistor has a source/drain coupled to a first match line segment, a drain/source coupled to a second match line segment, and a gate. The second transistor has a source/drain coupled to the true bit line, a drain/source coupled to the gate of the first transistor, and a gate coupled to the complement output of the memory cell. The third transistor has a source/drain coupled to the complement bit line, a drain/source coupled to the gate of the first transistor, and a gate coupled to the true output of the memory cell.

In preferred embodiments, the first match line segment is further coupled to a precharge circuit and the second match line segment is further coupled to a sense circuit. In one preferable case, in which the first channel type is n-channel and the second channel type is p-channel, the precharge circuit applies a logical high to the first match line segment during a precharge operation and a logical low during a comparison operation. In another preferable case, in which the first channel type is p-channel and the second channel type is n-channel, the precharge circuit applies a logical low to the first match line segment during a precharge operation and a logical high during a comparison operation.

In a further aspect, the present invention is a content addressable memory word comprising a plurality of content addressable memories according to the second broad aspect, a precharge circuit and a match sense circuit. In this aspect, the first transistor within each of the content addressable memories is coupled in series, via match line segments, to form a chain. As well, the chain further comprises two end nodes, a first end node coupled to the precharge circuit and a second end node coupled to the match sense circuit.

The present invention, according to a third broad aspect, is a content addressable memory word comprising a precharge circuit, a match sense circuit, and a plurality of content addressable memory cells that are capable of storing respective bits. Each of the content addressable memory cells comprises an n-channel match transistor which is coupled in series with the other n-channel match transistors to form a chain. The chain further includes a first end node coupled to the precharge circuit and a second end node coupled to the sense circuit. In this aspect, during a precharge operation, the precharge circuit applies a logical high voltage to the first end node. During a comparison operation, the precharge circuit applies a logical low voltage to the first end node and, for each of the content addressable memory cells, a particular reference bit is compared to its respective stored bit such that if they match, conductivity through a data path of the corresponding n-channel match transistor is enabled. A match condition is detected in this aspect at the match sense circuit if the second end node is subsequently discharged to a logical low voltage. In another aspect of the present invention an operation of opposite logic is possible if using p-channel match transistors.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

The preferred embodiment of the present invention is described with reference to the following figures, in which.

DETAILED DESCRIPTION OF THE PREFERRED EMBODIMENT

Figure 1A:
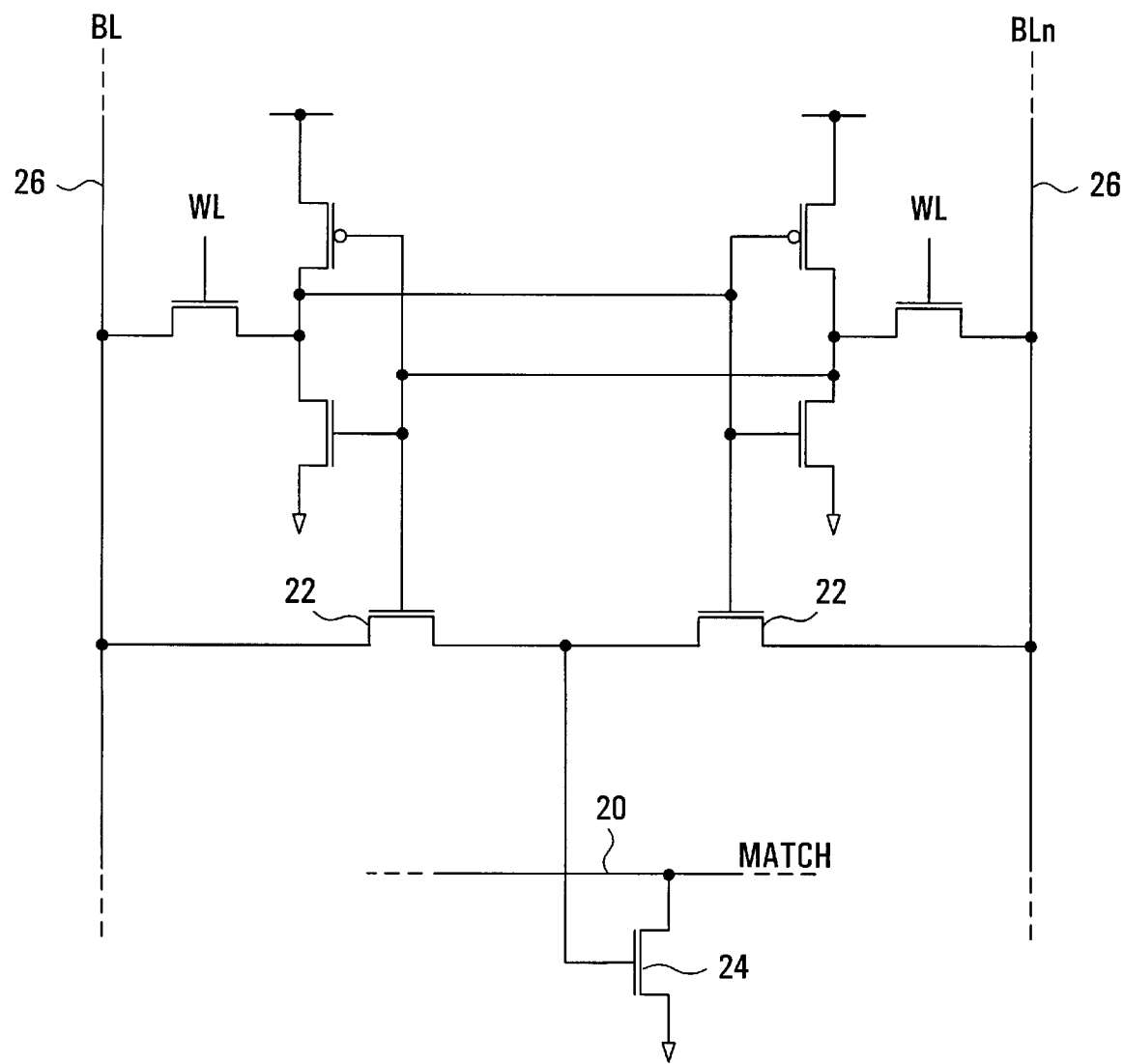
FIGS. 1A and 1B illustrate transistor-level schematic diagrams of well-known CAM cells.

The preferred embodiments of the present invention are directed to modifications within well-known CAM cells that mitigate one or more of the problems with the prior art. In these embodiments of the present invention, the pass transistors within the CAM cells and the transistors coupled to the match or match-not line are of opposite conductivity. These modifications allow for numerous advantages over previous implementations as will be described herein below and, in preferable embodiments, allow CAM cells to remain reliable and efficient as the supply voltage levels and fabrication process sizes used are further decreased.

CAM cells, according to first and second preferred embodiments of the present invention, that can be implemented within a NAND configured CAM are now described with reference to FIGS. 2A and 2B respectively. As will be described herein below, these CAM cell designs allow for a more reliable voltage on the gate of the n-channel chain transistors, a decrease in the deterioration of the n-channel chain transistors and an increase in the transition speed in the case of a match compared to a well-known NAND configured CAM. The CAM cells as depicted within FIGS. 2A and 2B each comprise a standard six transistor Static Random Access Memory (SRAM) cell 80 along with two p-channel pass transistors 82a, 82b and an n-channel chain transistor 84.

The standard six transistor SRAM cell 80 comprises first n-channel and p-channel transistors 86a, 88a which together form a first inverter and second n-channel and p-channel transistors 86b, 88b which together form a second inverter; these two inverters being cross-coupled such that the input of one is coupled to the output of the other, and vice versa. These cross-coupled inverters have a first node 90a that is coupled to the input of the second inverter and the output of the first inverter, and a second node 90b that is coupled to the input of the first inverter and the output of the second inverter. The cross-coupled inverters can operate in one of two logic states, these logic states being referred to as a "1" logic state and a "0" logic state. In the "1" logic state, the first node 90a is in a logical high state and the second node 90b is in a logical low state. In the "0" logic state, the first node 90a is in a logical low state and the second node 90b is in a logical high state. It should be recognized that the "0" and "1" logic states could alternatively be defined oppositely. The logic state for the cross-coupled inverters of the SRAM cell 80 is determined within a write operation as described in detail herein below.

The standard SRAM cell 80 further comprises a first data access n-channel transistor 92a coupled between the first node 90a and a first bit line BL 94a and a second data access n-channel transistor 92b coupled between the second node 90b and a second bit line BLn 94b. As depicted in FIGS. 2A and 2B, the gates of both the first and second data access transistors 92a, 92b are coupled to a word line WL. The first and second bit lines BL,BLn 94a, 94b together form a bit line pair that can have differential data comprising a single bit of data applied.

Figure 2A:
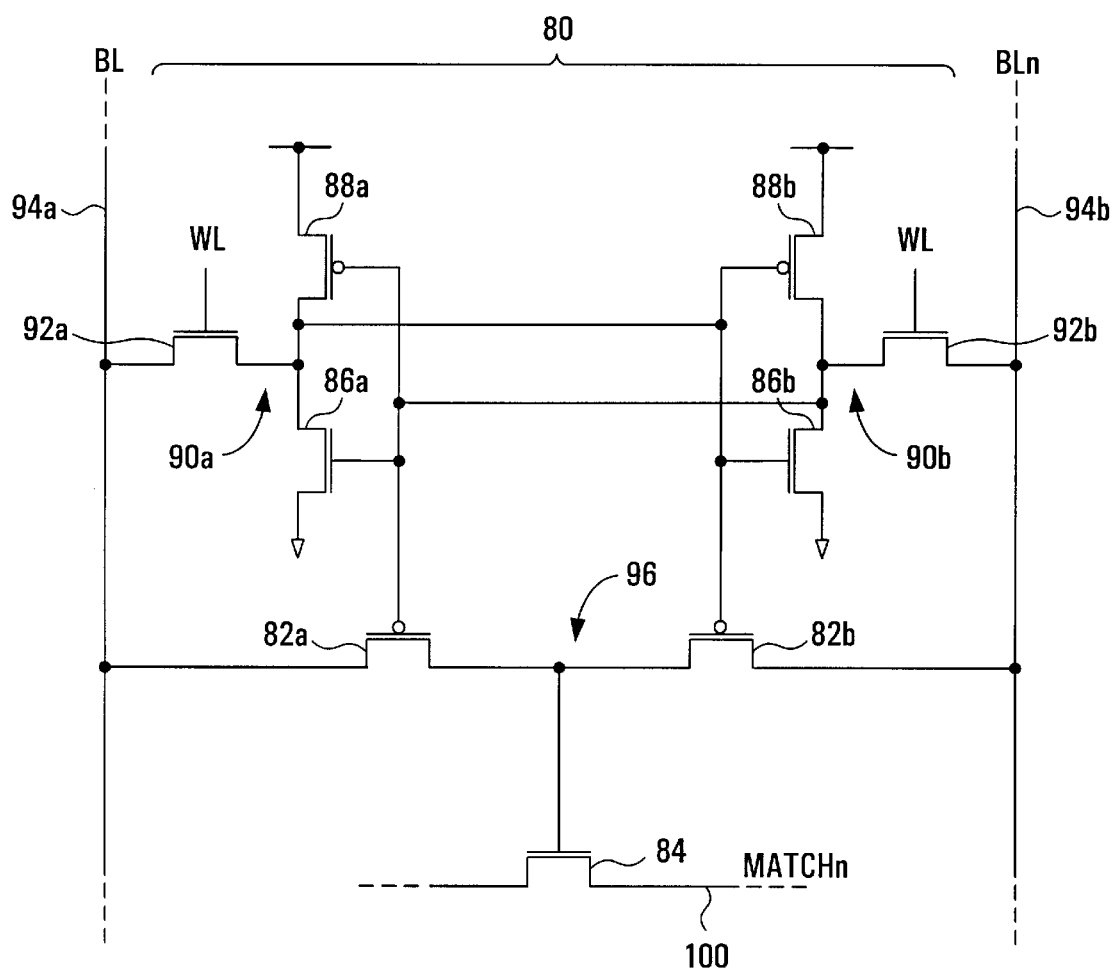
FIGS. 2A and 2B illustrate transistor-level schematic diagrams of CAM cells according to respective first and second preferred embodiments of the present invention.
Figure 2B:
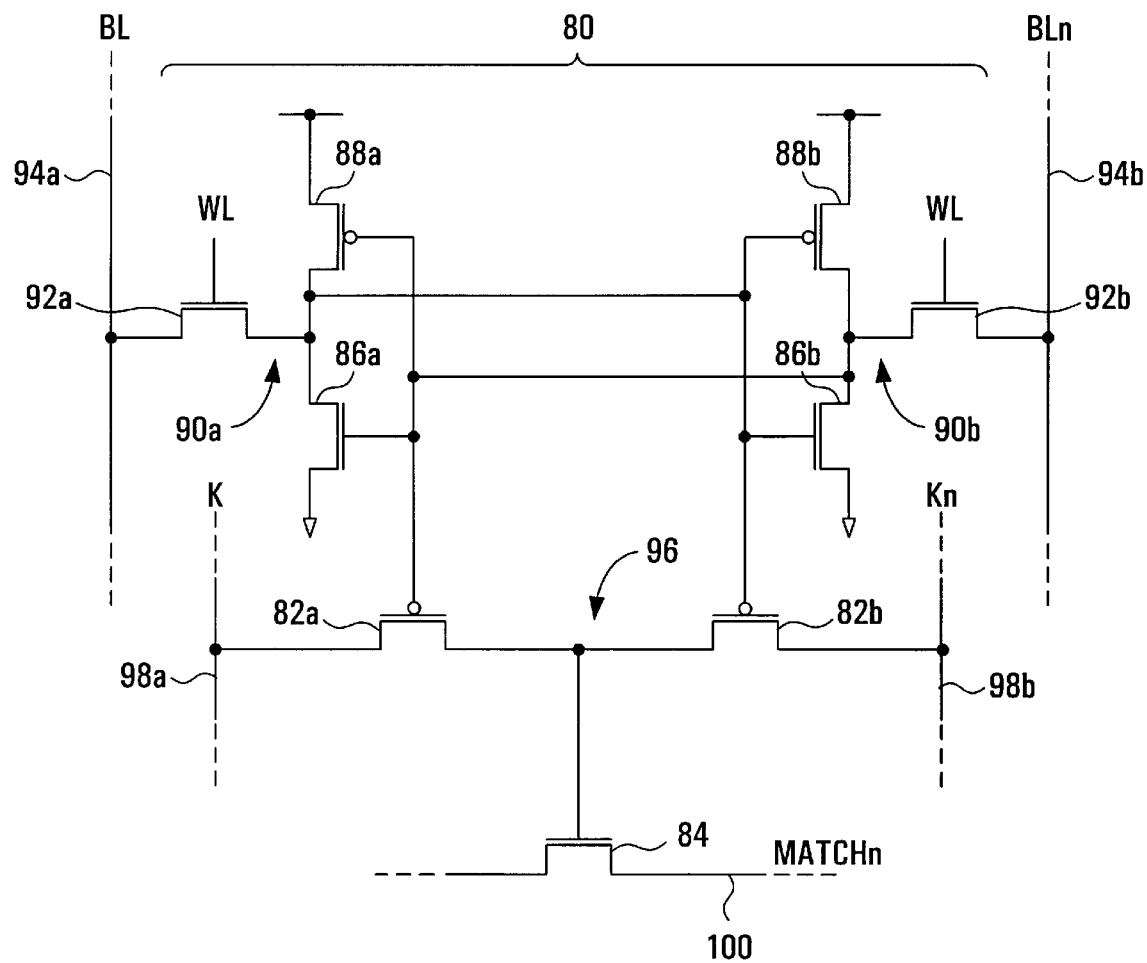

The difference between the CAM cells of FIGS. 2A and 2B relates to the configuration of the pass transistors 82a, 82b. The p-channel pass transistors 82a, 82b within the CAM cell of FIG. 2A are coupled between a common node 96 and respective ones of the bit lines BL,BLn 94a, 94b. On the other hand, the p-channel pass transistors 82a, 82b within the CAM cell of FIG. 2B are coupled between a common node 96 and respective first and second dedicated comparison bit lines K,Kn 98a, 98b. In either case, the n-channel chain transistor 84 has its gate coupled to the common node 98 and is further coupled in series with n-channel chain transistors within other CAM cells by a match-not line 100.

It is noted that a CAM cell similar to the schematic diagram of FIG. 2B but using the comparison bit lines K,Kn of FIG. 2B is disclosed within U.S. Pat. No. 5,859,791 entitled "Content Addressable Memory" by Shultz et al, issued on Jan. 12, 1999 and herein incorporated by reference.

In the first preferred embodiment depicted in FIG. 2A, the bit lines BL,BLn 94a,94b are preferably used during write, read and comparison operations within the CAM cell. On the other hand, for the second preferred embodiment depicted in FIG. 2B, the bit lines BL,BLn 94a,94b are preferably used during write and read operations within the CAM cell while the comparison bit lines K,Kn 98a, 98b are used during comparison operations. As will be described below, there are advantages and disadvantages to both of these embodiments. Preferable write, read and comparison operations for the CAM cells of FIGS. 2A and 2B will now be described in detail.

To write a logic state in the SRAM cell 80 of FIGS. 2A and 2B, a data bit is placed on the first bit line BL 94a and a complementary data bit is placed on the second bit line BLn 94b. Applying a logical high to the word line turns on the data access transistors 92a, 92b which thereby transfers the data bit and complementary data bit to the first and second nodes 90a, 90b respectively. The transfer of the data bit/complementary data bit to the respective nodes 90a, 90b decides (i.e. writes) the state ("1" or "0") for the particular SRAM cell 80. The word line is preferably an addressed signal such that only a selected set of CAM cells that are coupled to a common pair of bit lines are being written to at any one time, this set being a set of one within exemplary embodiments.

To read the logical state of the SRAM cell 80 of FIGS. 2A and 2B, the bit lines BL,BLn 94a, 94b are both initially precharged to a logical high state. Subsequently, if the particular CAM cell is selected by the addressing within the word line, the data access transistors 92a,92b are subsequently both turned on by a logical high on the word line being applied to their gates. The logic state ("1" or "0") stored by the SRAM cell 80 then pulls one of the bit lines lower than the other bit line. For example, if the SRAM cell 80 is in the logical state "1" with a logical high on the first node 90a and a logical low on the second node 90b, then the second bit line BLn 94b is discharged through transistors 92b and 86b to ground. The first bit line BL 94a, in this example, would remain in a logical high state, thus replicating the state of the first node 90a. After the data access transistors 92a, 92b are turned on, the CAM senses the state of the first and second bit lines BL,BLn 94a, 94b to determine (i.e. read) the state of the SRAM cell 80 within the CAM cell. This sensing operation is preferably performed with the use of sense amplifiers (not shown) within the CAM.

As stated above, the operation of the CAM cells depicted in FIGS. 2A and 2B during a comparison operation is slightly different. During a comparison operation within the CAM cell of FIG. 2A, a reference bit is placed on the first bit line BL 94a and a complement to the reference bit is placed on the second bit line BLn 94b. In this embodiment, the word line must be kept in a logical low state to ensure that the n-channel data access transistors 92a, 92b are turned off, in order to prevent the logic state of the SRAM cell 80 from being modified by the reference bit and complement of the reference bit being applied to the first and second bit lines BL,BLn 94a, 94b respectively. During a comparison operation within the CAM cell of FIG. 2B, a reference bit is placed on the first comparison bit line K 98a and a complement to the reference bit is placed on the second comparison bit line Kn 98b. In this embodiment, read operations could continue and thus, the word line does not have to be in a logical low state.

In either embodiment, if the reference bit is in the same logical state (high or low) as the first node 90*a*, and hence the complement of the reference bit is in the same logical state as the second node 90*b*, then a match occurs and a logical high will be passed to the common node 96 via one of the p-channel pass transistors 82*a*, 82*b*. There are two cases to consider for a match. The first case for a match is that the reference bit is a logical high, and therefore the complement to the reference bit is a logical low, when the SRAM cell 80 is within the "1" state. In this situation, due to the "1" state within the SRAM cell 80, the first and second pass transistors 82*a*, 82*b* have a logical low and a logical high respectively on their gates. This results in the first p-channel pass transistor 82*a* to switch on and the logical high on the first bit line BL 94*a* (for FIG. 2A) or the first comparison bit line K 98*a* (for FIG. 2B) to be passed to the common node 96. The second case for a match is that the reference bit is a logical low, and therefore the complement to the reference bit is a logical high, when the SRAM cell 80 is within the "0" state. In this situation, the first and second pass transistors 82*a*, 82*b* have a logical high and a logical low respectively on their gates due to the state of the SRAM cell 80. This results in the second p-channel pass transistor 82*b* to switch on and the logical high on the second bit line BLn 94*b* (for FIG. 2A) or the second comparison bit line Kn 98*b* (for FIG. 2B) to be passed to the common node 96. In either of the above cases, if the logical state of the reference bit was reversed, a match would not have occurred and a logical low would have been passed to the common node 96.

In the case of a match, the logical high being passed to the common node 96 is at the same voltage level as the logical high on the corresponding bit line or comparison bit line since p-channel transistors can pass a logical high voltage with no threshold voltage drop if a full logical low is applied to the gate of the particular p-channel transistor. This logical high on the common node 96 is applied to the gate of the n-channel chain transistor 84, thereby turning on the chain transistor 84. The advantages of having the logical high on the common node 96 be at the same voltage level as the logical high on the corresponding bit line or comparison bit line will be described herein below.

In the case of a mismatch, a logical low is passed to the common node 96, and therefore to the gate of the n-channel chain transistor 84. This logical low is a weak logical low due to the use of p-channel pass transistors but, as will be described below, a logical high to logical low transition on the source of the n-channel chain transistor 84 can result in sufficient boot strapping between the source and gate of the n-channel chain transistor 84 to ensure that the voltage on the gate is pulled down sufficiently to keep the n-channel chain transistor 84 turned off.

Figure 3A:
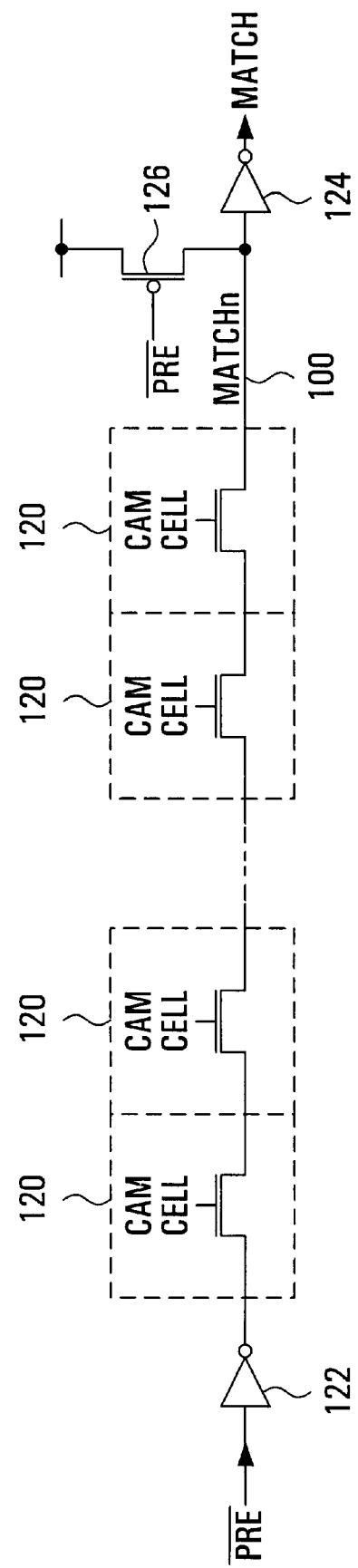
FIGS. 3A and 3B illustrate first and second embodiments for CAM word circuits comprising CAM cells of FIG. 2A or FIG. 2B.
Figure 3B:
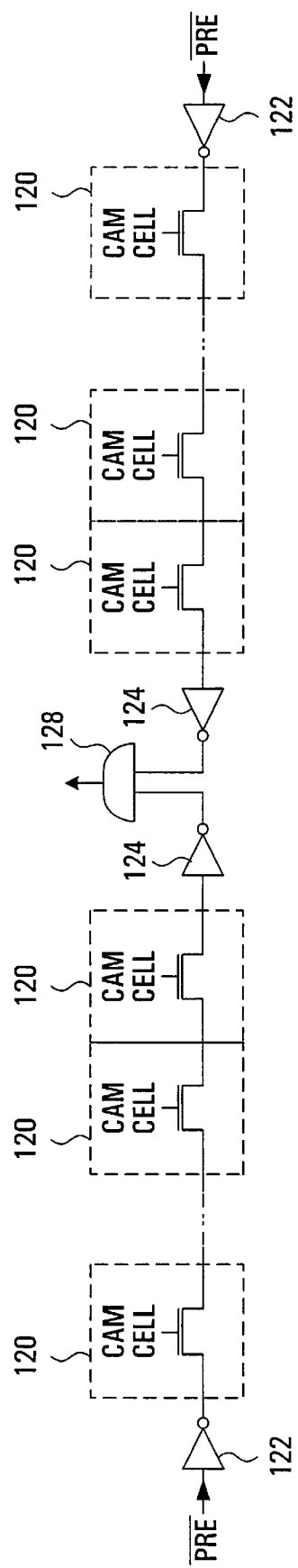
Figure 4:
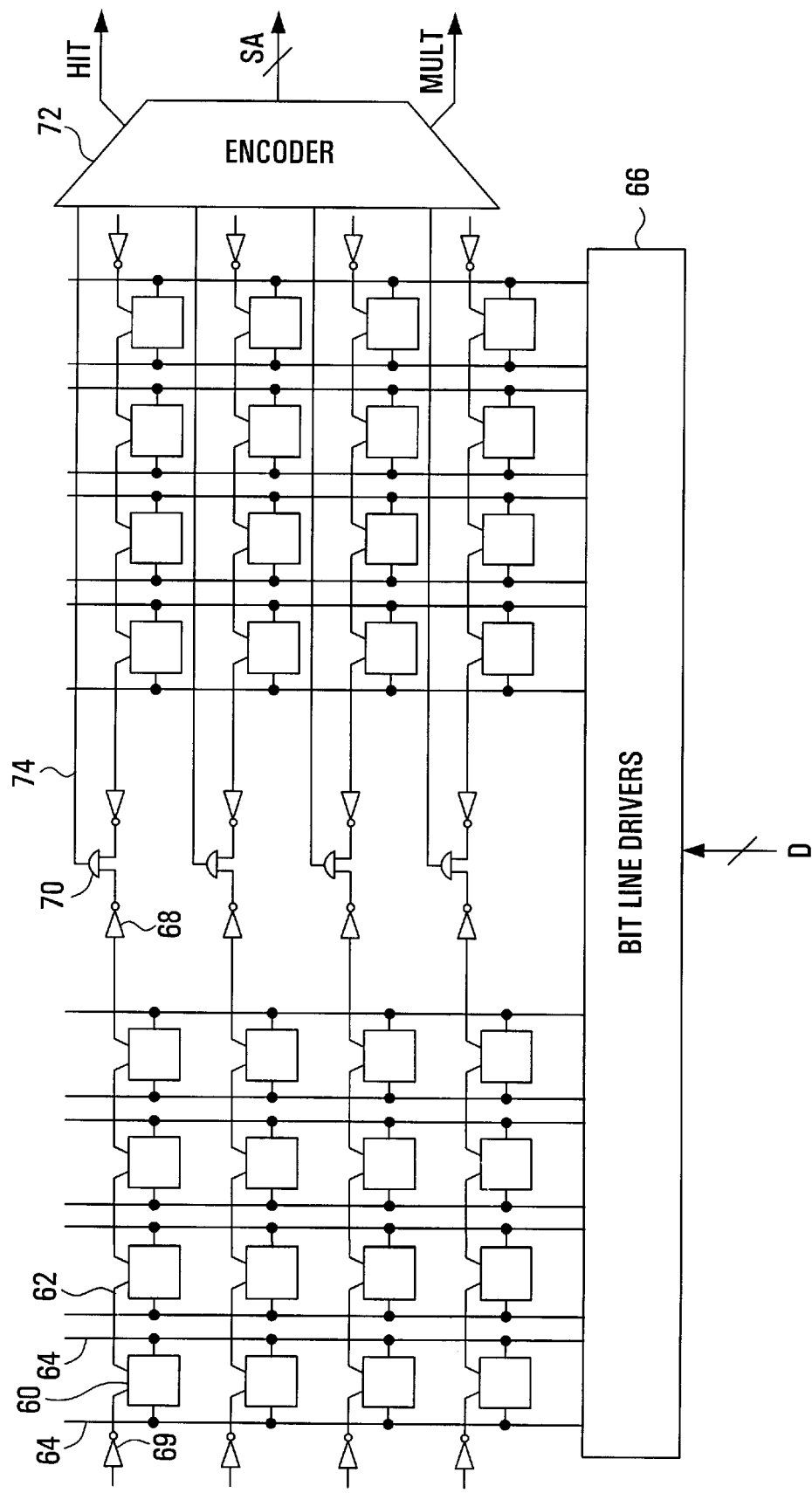
FIG. 4 illustrates an embodiment for an array of CAM cells comprising CAM cells of FIG. 2A or FIG. 2B.

A number of possible configurations for implementing words of CAM cells according to the first and second preferred embodiments are depicted in FIGS. 3A, 3B and 4. It is noted that portions of these preferred configurations are based upon those disclosed within U.S. Pat. No. 5,859,791 previously incorporated by reference and further configurations are possible that are not explicitly described below.

Within FIG. 3A, a plurality of CAM cells 120 that together constitute a word or at least a portion of a word are coupled in series to form a chain, the n-channel chain transistor 84 within each of these CAM cells 120 being the physical components that are coupled together in series. One end of the chain is coupled to a precharge circuit, in this case comprising an inverter 122 being input with a precharge signal, while the other end of the chain is coupled to a match-not sense circuit, in this case an inverter 124. Further coupled to the match-not line 100 is preferably a p-channel precharge transistor 126 which is further input with the precharge signal, the transistor 126 being coupled between the match-not line 100 and a power supply terminal.

During a comparison operation for this word, the precharge circuit 122 initially precharges the match-not line 100 to a logical high. In the particular embodiment of FIG. 3A, the p-channel precharge transistor 126 further turns on in order to ensure the node coupled to the sense circuit inverter 124 is initially set to a logical high. Next, the precharge circuit, with use of the inverter 122, causes a transition from a logical high to a logical low to occur on the end of the match-not line coupled to the precharge circuit; the p-channel precharge transistor 126 turns off; and each of the CAM cells 120 performs an individual comparison operation based upon a particular reference bit, these reference bits together forming a reference data word. If the word stored within the CAM cells perfectly matches the reference data word, each and every one of the chain transistors 84 within the CAM cells 120 would be turned on; otherwise, at least one of the chain transistors would be turned off. In the case of a match, the logical low that is now at the output of the inverter 122 would be propagated through the chain transistors 84 to the input of the sense circuit inverter 124 where it would be sensed, the output of the inverter 124 being a digital signal indicating whether a match occurred.

In the case of a mismatch, at least one of the n-channel chain transistors 84 would be turned off due to the boot strapping as described above. In this case, the precharged logical high state would be maintained on the match-not line 100 and a logical low output from the inverter 124 would remain.

As is disclosed within previously referenced U.S. Pat. No. 5,859,791, it can be advantageous to divide a word into a plurality of sections, each section comprising the components depicted in FIG. 3A. The advantage of such a division is the increase in the transition speed of the match signal when a match occurs while the disadvantage is the increased dissipation of power due to the possibility of partial matches causing a line transition.

FIG. 3B illustrates a word of CAM cells that are divided into two sections, each section being identical to the chain of FIG. 3A. The outputs from the inverters 124 are combined within an AND gate 128 in order to generate an overall word match signal. It is noted that, although not illustrated on FIG. 3B, p-channel precharge transistors as shown in FIG. 3A could also be included in FIG. 3B. This concept of dividing a word of CAM cells into multiple sections can be expanded yet further into further divisions and/or can be used within a CAM array embodiment utilizing the preferred CAM cells of either FIG. 2A or FIG. 2B as is depicted in FIG. 4.

FIG. 4 illustrates an embodiment of a single chip CAM array of w (=4) words, each occupying a row and each having b (=8) bits and b (=8) CAM cells 60. The words are divided into two halves, and the results of the match on each half word are combined. The array includes 16 CAM cells 60, each being at the intersection of a match-not line 62 and a pair of bit lines 64. In order to have differential data inserted onto the bit lines 64, the bit lines are connected to bit line drivers 66 which receive input data D. These bit line drivers 66 use this input data D to load the contents of the CAM cells 60 within the array during a write operation and to apply the reference data words to the CAM cells 60 during a comparison operation.

Each CAM cell 60 is preferably similar to that depicted in either FIG. 2A or FIG. 2B, though it is noted that a set of comparison bit lines K,Kn for each column would be required in the case of the CAM cells of FIG. 2B. Each of these CAM cells 60 can act to store a single bit of data and is capable of performing a single-bit comparison operation. The CAM cells 60 of each word are chained in the respective match line 62. One end of each chain is connected to an inverter 68 that acts as a sense circuit while the other end of the chain is connected to an inverter 69 which acts as a precharge circuit that is controlled by a precharge signal. The outputs of the inverters 68 are connected to an AND gate 70, the output of which is referred to as a "word match line" 74, the word match line 74 only gaining a logical high if there is a match on the corresponding word. The word match lines 74 are connected to an encoder 72 which produces three outputs representing the result of the comparison operation. A hit signal HIT will be asserted to a logical high state if any of the w words is storing data which has matched the particular reference data word that is applied. The binary address of this matching word is encoded and an address signal SA is provided. In the event that a plurality of words have matched the reference data word, a multi-match signal MULT is asserted to a logical high state. In this event, the address SA output from the encoder 72 may produce (a) an invalid result, (b) an address representing the location of a single one of the multiple matches, or (c) a sequence of outputs, representing the locations of each of the matched words. Note that some applications may not require the "MULT" result.

Figure 1B:
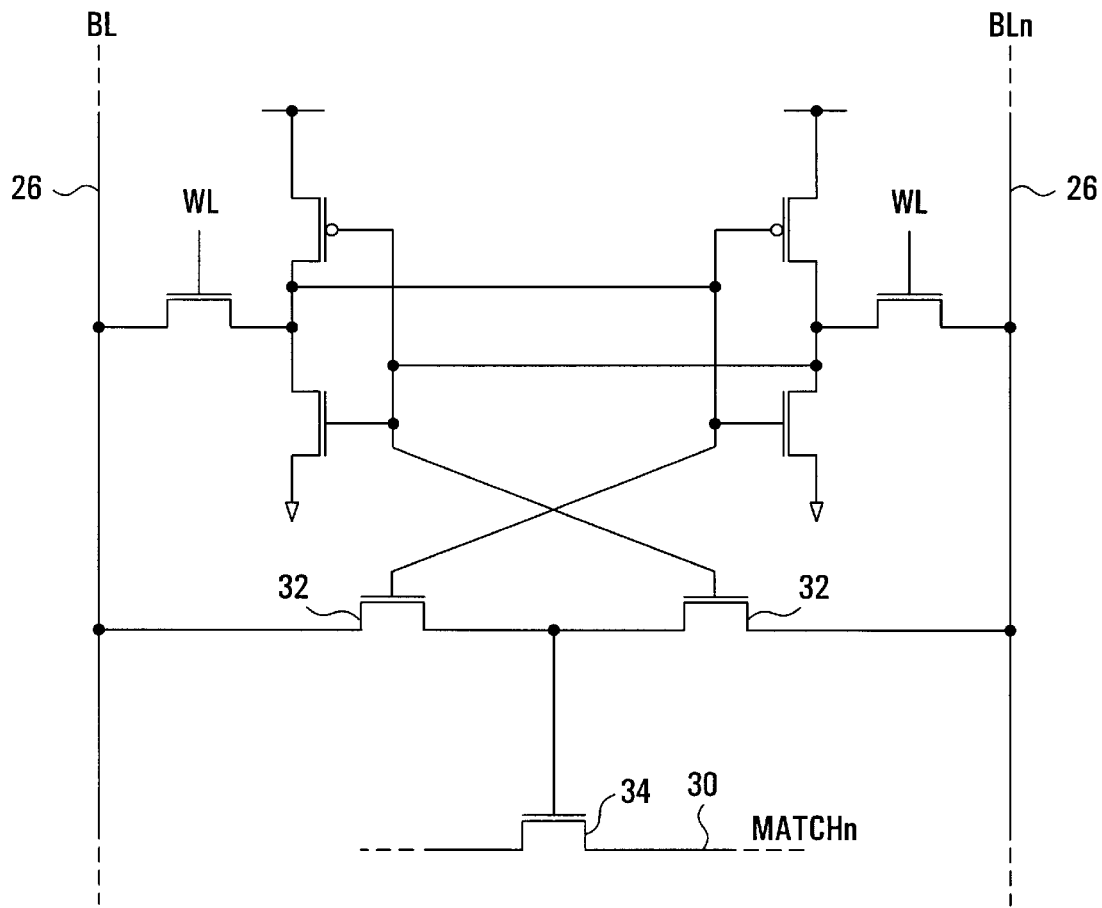

There are numerous advantages to the CAM cell designs of both FIG. 2A and FIG. 2B according to preferred embodiments of the present invention when compared to well-known CAM cell designs implemented within a NAND configuration, such as the CAM cell design depicted in FIG. 1B. One key advantage, as described above, concerns the use of the p-channel pass transistors 82a,82b to pass a logical high to the common node 96, in the case of a match, that is the same logical high as is on the corresponding bit line (for FIG. 2A) or comparison bit line (for FIG. 2B). In this case, a full logical high without a threshold voltage drop could be applied to the gate of the chain transistor 84, thereby allowing the n-channel chain transistor 84 to turn on fully without the use of boot strapping. In this case, the transition within the match line can be from a logical high to logical low since the only boot strapping that occurs in these preferred embodiments is a negative boot strapping on the gate of the n-channel chain transistor in the case of a mismatch. The disadvantages, as discussed above, are significant for the boot strapping during a match condition within previous CAM cell designs, especially as the supply voltages used within CAMs decrease. On the other hand, the disadvantages of negative boot strapping during a mismatch condition is less significant since the timings of a mismatch condition and the reliability of the voltage at the gate of the n-channel chain transistors 84 are less critical.

One problem with the boot strapping operation that occurs during a match condition in previous NAND configured CAM cell designs is the resulting unreliability concerning the voltage on the common node 96, this voltage changing non-linearly with respect to the operating conditions. This unreliability results in an unreliable voltage level being passed through the n-channel chain transistors and hence uncertainty concerning the reliability concerning detecting a match condition. This uncertainty does not occur in the CAM cells according to the preferred embodiments of the present invention described above since, in the case of a match, a full logical low is passed to the sense circuit. Further, compared to well-known CAM cells that have their n-channel chain transistors operating in a boot strapped operation in order to propagate a logical high to the sense circuit, the CAM cell embodiments of FIGS. 2A and 2B allow for a faster detection of a match condition at the sense circuit. Yet further, the lack of a voltage higher than a normal logical high on the common node 96 caused by boot strapping, reduces the degradation on the n-channel chain transistors 84 caused by the hot electron effect and essentially can increase their life span. It is also noted that the p-channel pass transistors 82a,82b further will not degrade at the same rate as the n-channel pass transistors of the previous well-known CAM cell designs. Even further, the number of CAM cells implemented within a single chain can possibly be increased within the embodiments of the present invention; and the lack of reliance on boot strapping during a match condition in the preferred embodiments can possibly reduce the power dissipation that results from such a comparison operation.

There are further advantages of the CAM cell designs of FIGS. 2A and 2B due to the use of p-channel pass transistors 82a,82b to pass a logical high to the common node 96 when a match occurs. The use of p-channel transistors to pass a logical high when a match occurs results in a higher speed for the propagation of the logical high to the common node 96. This increase in speed can further allow for a decrease in the width size of the p-channel pass transistors 82a,82b compared to the equivalent n-channel pass transistors 32 of FIG. 1B. Any decrease in size of these pass transistors results in an accompanying decrease in load on the bit lines (for FIG. 2A) or comparison bit lines (for FIG. 2B) and hence increases the number of CAM cells each bit line can be coupled to.

The decrease in supply voltage levels and process fabrication size currently taking place within industry are causing the degradation of transistors to increase, the power dissipation of transistors to increase, and speeds for transitions of state within transistors to decrease. Hence, the implementation of the CAM cells of the first and/or second preferred embodiments, which can mitigate one or more of these problems, is especially important as supply voltages and fabrication processes continue to be reduced.

As mentioned previously, there are advantages and disadvantages between the CAM cell designs according to the first and second embodiments of the present invention illustrated in FIGS. 2A and 2B respectively. The key advantage of using the normal bit lines BL,BLn 94a,94b within the comparison operation is the reduction in metal layers that this implementation allows compared to the CAM cell of FIG. 2B. The comparison bit lines K,Kn 98a,98b within FIG. 2B would typically require a dedicated metal layer which in turn increases the complexity of the circuit design and process flow, thereby increasing the costs associated with manufacturing such a CAM. The advantages of the CAM cell of the second preferred embodiment, on the other hand, is the decreased capacitive load that is exerted on the normal bit lines BL,BLn 94a,94b, hence decreasing power dissipation and increasing speed. Further, the use of separate comparison bit lines K,Kn 98a,98b allows the CAM cell to operate within read and comparison operations in close succession. This is possible within the CAM cell of FIG. 2B since, during a comparison operation, the data access transistors 92a,92b do not have to be turned off and the bit lines BL,BLn 94a,94b are not being used.

Figure 5A:
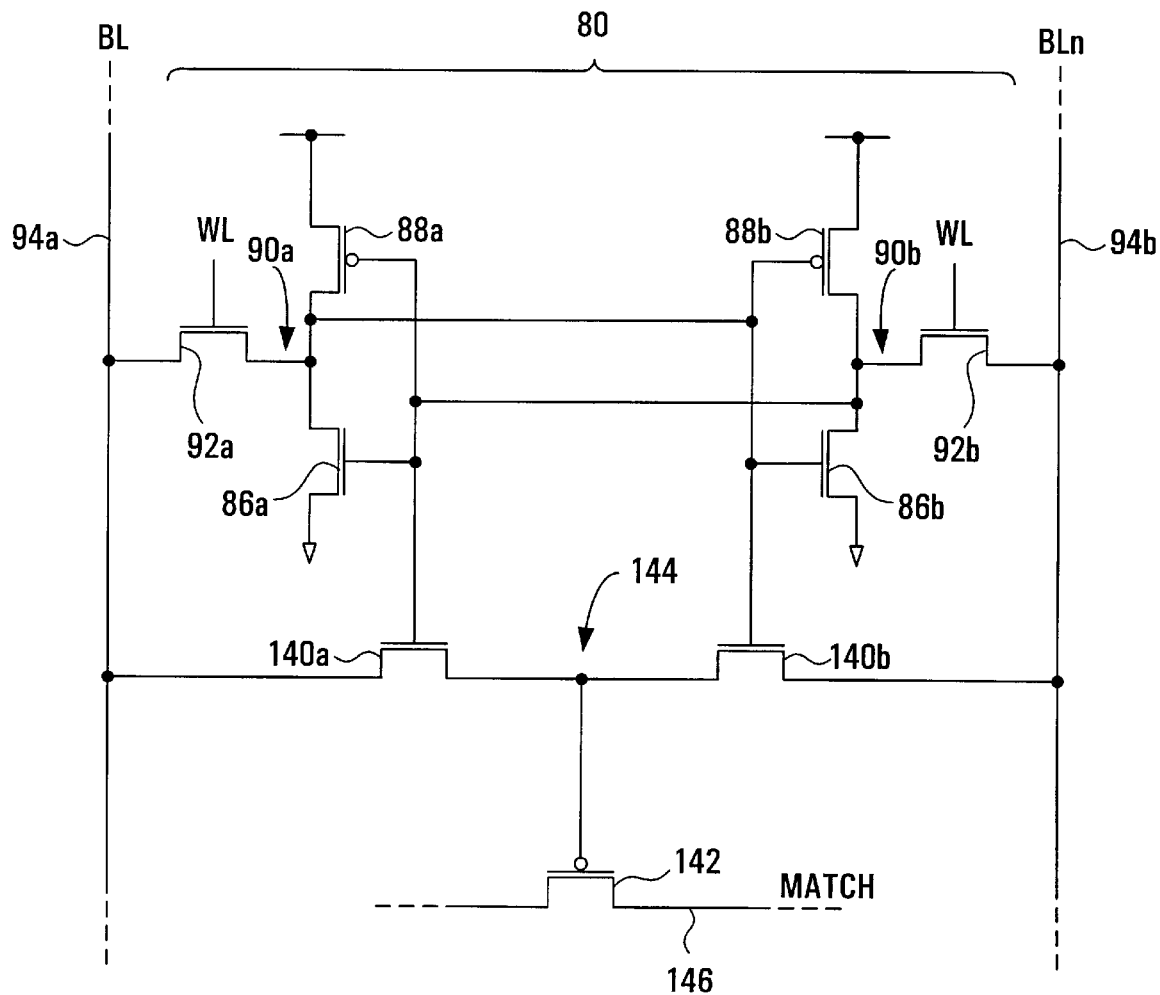
FIGS. 5A and 5B illustrate transistor-level schematic diagrams of CAM cells according to respective third and fourth preferred embodiments of the present invention.
Figure 5B:
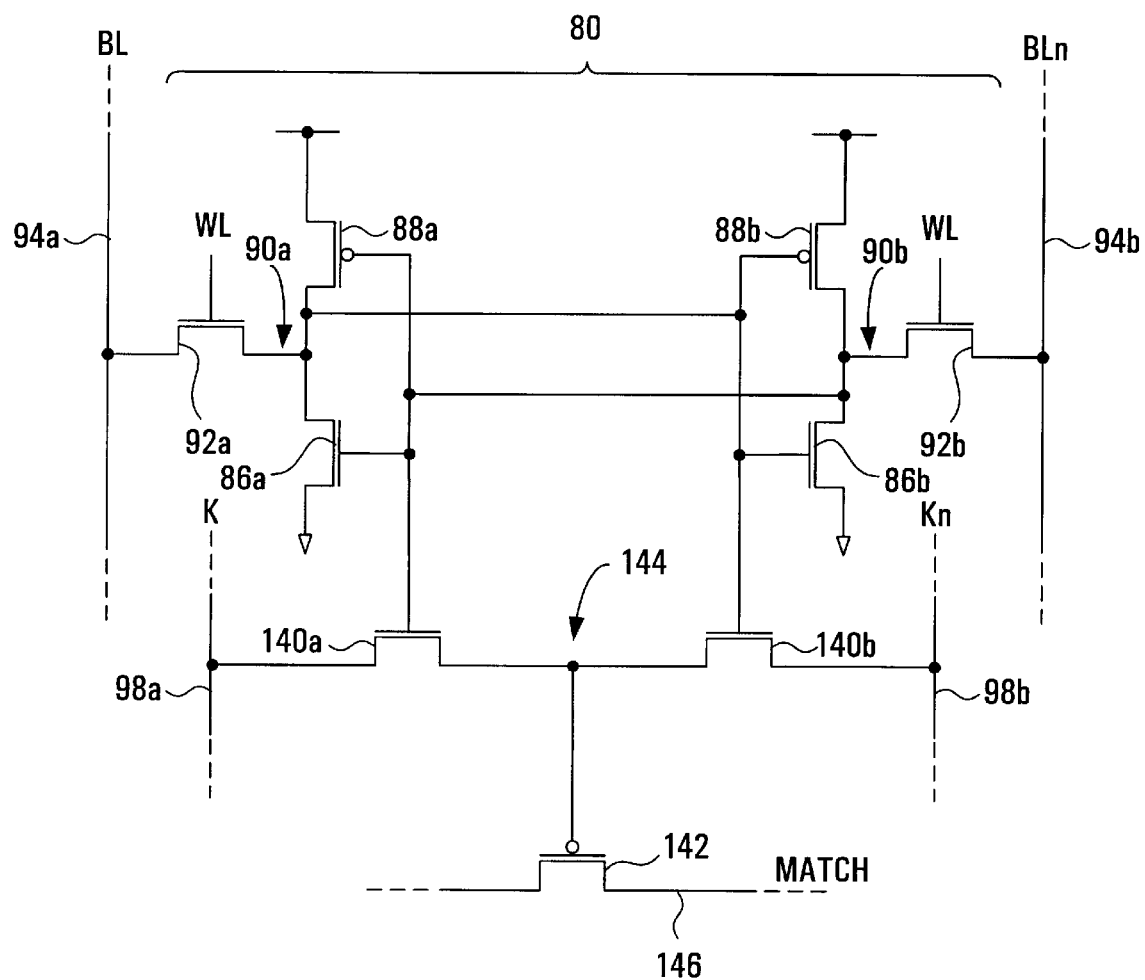

FIGS. 5A and 5B illustrate CAM cells according to third and fourth preferred embodiments respectively of the present invention. The embodiments depicted in FIGS. 5A and 5B are almost identical to the embodiments depicted within FIGS. 2A and 2B respectively but with the channel type of the pass transistors and chain transistor within the CAM cell reversed. In the cases illustrated in FIGS. 5A and 5B, n-channel pass transistors 140a,140b and a p-channel chain transistor 142 are comprised within the CAM cells. For the case of the third preferred embodiment illustrated in FIG. 5A, the CAM cell comprises first and second n-channel pass transistors 140a,140b coupled between the respective first and second bit lines BL,BLn 94a,94b and a common node 144. For the case of the fourth preferred embodiment illustrated in FIG. 5B, the CAM cell comprises first and second n-channel pass transistors 140a,140b coupled between the respective first and second comparison bit lines K,Kn 98a,98b and a common node 144. In either case, the gates of the first and second n-channel pass transistors 140a,140b are coupled to the second and first nodes 90b,90a respectively within the SRAM cell 80. The CAM cell further comprises a p-channel chain transistor 142 coupled in series with p-channel chain transistors within other CAM cells by a match line 146, the gate of the p-channel chain transistor 142 being coupled to the common node 144.

The write and read operations of the CAM cells illustrated in FIGS. 5A and 5B are preferably identical to those described herein above for the CAM cells of FIGS. 2A and 2B. The operation of the comparison operation, on the other hand, operates in the same manner as previously described but essentially within opposite logical states. Similar to the previous description, if using the CAM cell of FIG. 5A for a comparison operation, the word line would be in a logical high state, a reference bit would be applied to the first bit line BL 94a and a complement of the reference bit would be applied to the second bit line BLn 94b. If the CAM cell of FIG. 5B was within a comparison operation, a reference bit would be applied to the first comparison bit line K 98a and a complement of the reference bit would be applied to the second comparison bit line Kn 98b.

In either embodiment, if the reference bit is in the same logical state (high or low) as the first node 90a, and hence the complement of the reference bit is in the same logical state as the second node 90b, then a match occurs and a logical low will be passed to the common node 144 via one of the n-channel pass transistors 140a,140b. There are two cases to consider for a match. The first case for a match is that the reference bit is a logical high, and therefore the complement to the reference bit is a logical low, when the SRAM cell 80 is within the "1" state. In this situation, due to the "1" state within the SRAM cell 80, the first and second pass transistors 140a,140b have a logical low and a logical high respectively on their gates. This results in the second n-channel pass transistor 140b to switch on and the logical low on the second bit line BLn 94b (for FIG. 5A) or the second comparison bit line Kn 98b (for FIG. 5B) to be passed to the common node 144. The second case for a match is that the reference bit is a logical low, and therefore the complement to the reference bit is a logical high, when the SRAM cell 80 is within the "0" state. In this situation, the first and second pass transistors 140a,140b have a logical high and a logical low respectively on their gates due to the state of the SRAM cell 80. This results in the first n-channel pass transistor 140a to switch on and the logical low on the first bit line BL 94a (for FIG. 5A) or the first comparison bit line K 98a (for FIG. 5B) to be passed to the common node 144. In either of the above cases, if the logical state of the reference bit was reversed, a match would not have occurred and a logical high would have been passed to the common node 144.

In the case of a match, the logical low being passed to the common node 144 is at the same voltage level as the logical low on the corresponding bit line or comparison bit line since n-channel transistors can pass a logical low voltage with no threshold voltage gain if a full logical high is applied to the gate of the particular n-channel transistor. This logical low on the common node 144 is applied to the gate of the p-channel chain transistor 142, thereby turning on the chain transistor 142. The advantages of having the logical low on the common node 144 be at the same voltage level as the logical low on the corresponding bit line or comparison bit line will be described herein below.

In the case of a mismatch, a logical high is passed to the common node 144, and therefore to the gate of the p-channel chain transistor 142. This logical high is not a full logical high due to the use of n-channel pass transistors but, as will be described below, a logical low to logical high transition on the source of the p-channel chain transistor 142 can result in sufficient boot strapping between the source and gate of the p-channel chain transistor 142 to ensure that the voltage on the gate is pulled down sufficiently to keep the p-channel chain transistor 142 turned off. It is noted that this boot strapping during a mismatch condition has some of the disadvantages described above for the well-known CAM cell designs, though as will be described below there are still advantages to the third and further preferred embodiments of the present invention.

Figure 6:
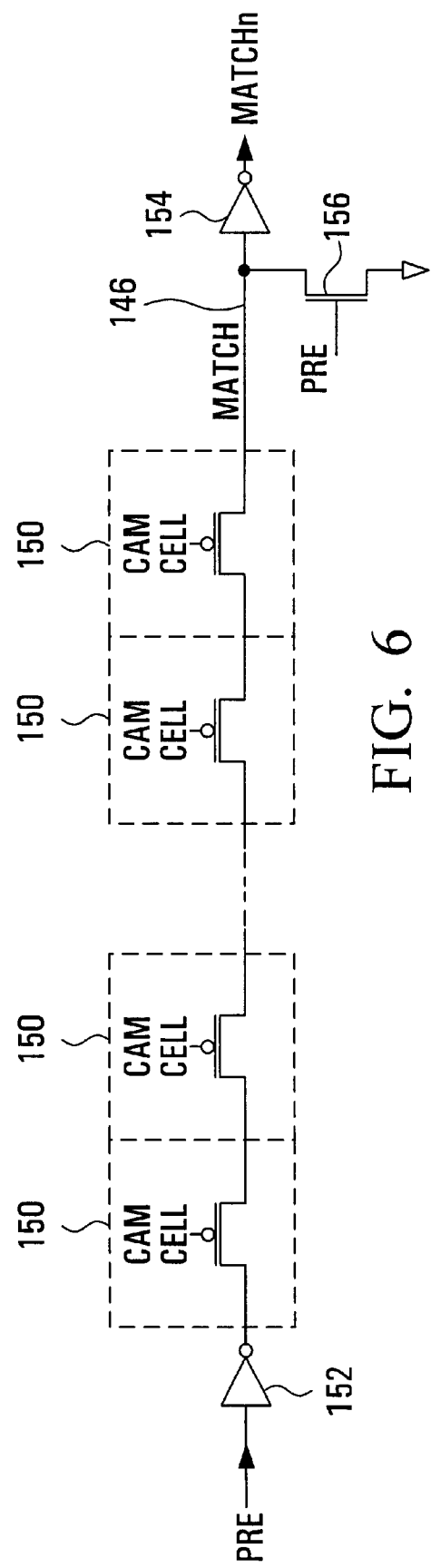
FIG. 6 illustrates an embodiment for a CAM word circuit comprising CAM cells of FIG. 5A or FIG. 5B.

A number of configurations for implementing words of CAM cells according to the third and fourth preferred embodiments are possible, one of which is depicted in FIG. 6. Within FIG. 6, a plurality of CAM cells 150 that together constitute a word or at least a portion of a word are coupled in series to form a chain, the p-channel chain transistor 142 within each of these CAM cells 150 being the physical components that are coupled together in series. One end of the chain is coupled to a precharge circuit, in this case comprising an inverter 152 being input with a precharge signal, while the other end of the chain is coupled to a match-not sense circuit, in this case an inverter 154. Further coupled to the match line 146 is preferably an n-channel precharge transistor 156 which is further input with the precharge signal, the transistor 156 being coupled between the match line 146 and a ground supply terminal.

During a comparison operation for this word, the precharge circuit 152 initially precharges the match line 146 to a logical low. In the particular embodiment of FIG. 6, the n-channel precharge transistor 156 further turns on in order to ensure the node coupled to the sense circuit inverter 154 is initially set to a logical low. Next, the precharge circuit, with use of the inverter 152, causes a transition from a logical low to a logical high to occur on the end of the match line coupled to the precharge circuit; the n-channel precharge transistor 156 turns off; and each of the CAM cells 150 performs an individual comparison operation based upon a particular reference bit, these reference bits together forming a reference data word. If the word stored within the CAM cells perfectly matches the reference data word, each and every one of the chain transistors 142 within the CAM cells 150 would be turned on; otherwise, at least one of the chain transistors would be turned off. In the case of a match, the logical high that is now at the output of the inverter 152 would be propagated through the chain transistors 142 to the input of the sense circuit inverter 154 where it would be sensed, the output of the inverter 154 being a digital signal indicating whether a match occurred.

In the case of a mismatch, at least one of the p-channel chain transistors 142 would be turned off due to the boot strapping as described above. In this case, the precharged logical low state would be maintained on the match line 146 and a logical high output from the inverter 154 would remain.

The advantages to the CAM cell designs of FIGS. 5A and 5B according to preferred embodiments of the present invention when compared to well-known CAM cell designs implemented within a NAND configuration virtually mirror the advantages described previously for the CAM cells of FIGS. 2A and 2B. For instance, a key advantage concerns the use of the n-channel pass transistors 140a,140b to pass a logical low to the common node 144, in the case of a match, that is the same logical low as is on the corresponding bit line (for FIG. 5A) or comparison bit line (for FIG. 5B). In this case, a full logical low could be applied to the gate of the chain transistor 142, thereby allowing the p-channel chain transistor 142 to turn on fully. This allows for a reliable logical high voltage to be passed through the p-channel pass transistors; allows for the speed for propagating the logical high to the sense circuit to be high; and the voltage change through each p-channel chain transistor 142 to be low, hence allowing for a large number of CAM cells to possibly be implemented within a single chain. The key disadvantage of the third and fourth preferred embodiments of the present invention concern the possible degradation of the n-channel pass transistors 140a,140b during mismatch conditions caused by the boot strapping of a high voltage on the common node 144.

As described previously for the first and second preferred embodiments, the implementation of the CAM cells of the third and/or fourth preferred embodiments, can mitigate one or more of the problems resulting from supply voltages and fabrication processes continuing to be reduced.

The advantages and disadvantages between the third and fourth preferred embodiments depicted in FIGS. 5A and 5B respectively are identical to those described previously for the differences between the first and second preferred embodiments of FIGS. 2A and 2B respectively.

There are numerous alternatives that can be made within the preferred embodiments described above while still remaining within the scope of the present invention. For instance a number of modifications or replacements for the SRAM cell 80 should be understood. In general, any memory cell type could be used such as a Dynamic Random Access Memory (DRAM) cell or a FLASH memory cell. The key is that the CAM cell according to the present invention contains a memory cell that is capable of storing a data bit and is capable of being "tapped" for comparison purposes to a reference bit. In one alternative, the data bit stored on the memory cell is permanent and in this case no write operation functionality is required within the memory cell. Further, other memory cells do not operate within a read operation while remaining within the scope of the present invention.

A further alternative that could be implemented within the CAM cells of the preferred embodiments is the addition of further transistors. Some purposes for additional transistors include precharging particular nodes within the CAM cells, disabling/enabling a comparison operation (and/or one of the read and write operations for that matter), or another control function deemed necessary for a particular design. These additional transistors could be coupled between components within the CAM cell described above or simply coupled to one or more of the nodes of the CAM cell.

Although the descriptions of embodiments of the present invention have disclosed particular configurations for grouping a plurality of CAM cells into words, these should not limit the scope of the present invention. For instance, there are many possible ways to implement a match line chain, in terms of polarity selection, precharge, evaluation timing and control. A number of these different match line chains that could be used with the CAM cells, according to embodiments of the present invention are disclosed within previously referenced U.S. Pat. No. 5,859,791. Further, although all example designs shown represent the match line precharge circuit and the match line sense circuit as simple inverters, in fact, these circuits may be implemented as any static and/or or dynamic voltage precharge and sense devices.

There are numerous terms used throughout the present document which could be referred to as or are more commonly known by alternative names. For instance, the first and second nodes 90a,90b within the memory cell (preferably the SRAM cell 80) could simply be referred to as true and complementary nodes respectively, the true node having the logical level that determines the state for the memory cell and the complementary node having the opposite logical state. In a general memory cell, these true and complementary nodes could have corresponding true and complementary outputs. Similarly, the first and second bit lines 94a,94b can be considered true and complement bit lines respectively and the first and second comparison bit lines 98a,98b can be considered true and complement comparison bit lines respectively.

Further, although the CAM cells of the above described embodiments have one of an n-channel chain transistor and a p-channel chain transistor, it could be considered that each CAM cell comprises a match transistor of a particular channel type that determines a match condition. In the embodiments of the present invention, the match condition refers to the turning on or off of the match transistor, the operation of this match transistor indicating whether a match or mismatch occurs.

Yet further, despite the embodiments described having either a match line in the case that a match condition causes a logical high on the line or a match-not line in the case that a match condition causes a logical low on the line, this line which is preferably coupled to the match transistor can be generally referred to as a match line in either condition. In the case of chained match transistors within a word, the match line can be considered to comprise a plurality of match line segments, one of the match line segments being coupled between each adjacent pair of CAM cells and other match line segments at the ends of the chain being coupled to the precharge circuit and the match sense circuit.

Persons skilled in the art will appreciate that there are yet more alternative implementations and modifications possible for implementing the present invention, and that the above implementations are only illustrations of certain embodiments of the invention. The scope of the invention, therefore, is only to be limited by the claims appended hereto.

We claim:

1. A content addressable memory comprising:
    a memory cell having a true output and a complement output;
    true and complement bit lines;
    a first field effect transistor having a source/drain connected to the true output of the memory cell, a drain/source connected to the true bit line, and a gate;
    a second field effect transistor having a source/drain coupled to the complement output of the memory cell, a drain/source coupled to the complement bit line, and a gate;

a word line connected to the gates of the first and second transistors;

a third field effect transistor of a first channel type having a source/drain coupled to a first match line segment, a drain/source coupled to a second match line segment, and a gate;

true and complement comparison bit lines;

a fourth field effect transistor of a second different channel type having a source/drain coupled to the true comparison bit line, a drain/source coupled to the gate of the third transistor, and a gate coupled to the complement output of the memory cell; and a fifth field effect transistor of the second channel type having a source/drain coupled to the complement comparison bit line, a drain/source coupled to the gate of the third transistor, and a gate coupled to the true output of the memory cell.

2. A content addressable memory according to claim 1, wherein the first channel type is n-channel and the second channel type is p-channel.

3. A content addressable memory according to claim 2, wherein the first match line segment is further coupled to a precharge circuit that applies a logical high to the first match line segment during a precharge operation and a logical low during a comparison operation; and the second match line segment is further coupled to a match sense circuit.

4. A content addressable memory according to claim 1, wherein the first channel type is p-channel and the second channel type is n-channel.

5. A content addressable memory according to claim 4, wherein the first match line segment is further coupled to a precharge circuit that applies a logical low to the first match line segment during a precharge operation and a logical high during a comparison operation; and the second match line segment is further coupled to a match sense circuit.

6. A content addressable memory according to claim 1, wherein the memory cell comprises a Static Random Access Memory (SRAM) cell.

7. A content addressable memory word comprising a plurality of content addressable memories according to claim 1, a precharge circuit and a match sense circuit;

wherein the third transistor within each of the content addressable memories is coupled in series, via match line segments, to form a chain; and the chain further comprises two end nodes, a first end node coupled to the precharge circuit and a second end node coupled to the match sense circuit.

8. A content addressable memory word according to claim 7, wherein the first channel type is n-channel and the second channel type is p-channel;

wherein, during a precharge operation, the precharge circuit applies a logical high to the first end node; and, during a comparison operation, the precharge circuit applies a logical low to the first end node and, for each of the content addressable memories, a particular reference bit is applied to its true bit line and a complement to the reference bit is applied to its complement bit line; and wherein a match condition is detected by the match sense circuit if the second end node is subsequently discharged to a logical low voltage.

9. A content addressable memory word according to claim 7, wherein the first channel type is p-channel and the second channel type is n-channel;

wherein, during a precharge operation, the precharge circuit applies a logical low to the first end node; and, during a comparison operation, the precharge circuit applies a logical high to the first end node and, for each of the content addressable memories, a particular reference bit is applied to its true bit line and a complement to the reference bit is applied to its complement bit line; and wherein a match condition is detected by the match sense circuit if the second end node is subsequently charged to a logical high voltage.

10. A content addressable memory word according to claim 7, wherein the precharge circuit is an inverter comprising an input coupled to a precharge signal and an output coupled to the first end node.

11. A content addressable memory word according to claim 7, wherein the match sense circuit is an inverter comprising an input coupled to the second end node and an output coupled to an output match signal.

12. A content addressable memory word comprising:

a precharge circuit;

a match sense circuit; and a plurality of content addressable memory cells, capable of storing respective bits, each comprising an n-channel match transistor which is coupled in series with the other n-channel match transistors to form a chain, the chain further comprising a first end node coupled to the precharge circuit and a second end node coupled to the sense circuit;

wherein, during a precharge operation, the precharge circuit applies a logical high voltage to the first end node; and, during a comparison operation, the precharge circuit applies a logical low voltage to the first end node and, for each of the content addressable memory cells, a particular reference bit is compared to its respective stored bit such that if they match, conductivity through a data path of the corresponding n-channel match transistor is enabled; and wherein a match condition is detected at the match sense circuit if the second end node is subsequently discharged to a logical low voltage.

13. A content addressable memory word comprising:

a precharge circuit;

a match sense circuit; and a plurality of content addressable memory cells, capable of storing respective bits, each comprising a p-channel match transistor which is coupled in series with the other p-channel match transistors to form a chain, the chain further comprising a first end node coupled to the precharge circuit and a second end node coupled to the sense circuit;

wherein, during a precharge operation, the precharge circuit applies a logical low voltage to the first end node; and, during a comparison operation, the precharge circuit applies a logical high voltage to the first end node and, for each of the content addressable memory cells, a particular reference bit is compared to its respective stored bit such that if they match, conductivity through a data path of the corresponding p-channel match transistor is enabled; and wherein a match condition is detected at the match sense circuit if the second end node is subsequently charged to a logical high voltage.

14. A content addressable memory word according to claim 12, wherein each of the content addressable memory cells further comprises a memory cell and a plurality of p-channel pass transistors connected to the memory cell such that a logic state of the memory cell controls the conductivity of respective data paths through the pass transistors; and wherein, for each of the content addressable memory cells, the corresponding match transistor is connected to the data paths of the pass transistors in order to enable conductivity through the data path of the match transistor if the reference bit matches its respective stored bit.

15. A content addressable memory word according to claim 14, wherein the memory cell comprises a Static Random Access Memory (SRAM) cell.

16. A content addressable memory word according to claim 13, wherein each of the content addressable memory cells further comprises a memory cell and a plurality of n-channel pass transistors connected to the memory cell such that a logic state of the memory cell controls the conductivity of respective data paths through the pass transistors; and wherein, for each of the content addressable memory cells, the corresponding match transistor is connected to the data paths of the pass transistors in order to enable conductivity through the data path of the match transistor if the reference bit matches its respective stored bit.

17. A content addressable memory word according to claim 16, wherein the memory cell comprises a Static Random Access Memory (SRAM) cell.

* * * * *